United States Patent [19]

Murai et al.

[11] Patent Number: 5,501,172
[45] Date of Patent: Mar. 26, 1996

[54] METHOD OF GROWING SILICON SINGLE CRYSTALS

[75] Inventors: Toshinari Murai; Eiichi Iino; Hideo Arai, all of Gunma; Izumi Fusegawa, Fukushima; Hirotoshi Yamagishi, Gunma, all of Japan

[73] Assignee: Shin-Etsu Handotai Co., Ltd., Japan

[21] Appl. No.: 395,837

[22] Filed: Feb. 28, 1995

[30] Foreign Application Priority Data

Mar. 11, 1994 [JP] Japan .................................. 6-041360

[51] Int. Cl.$^6$ .................................. C30B 15/20
[52] U.S. Cl. .................................. 117/15; 117/13; 117/14; 117/35; 117/932
[58] Field of Search .................................. 117/13, 14, 15, 117/35, 932

[56] References Cited

U.S. PATENT DOCUMENTS

| | | | |
|---|---|---|---|
| 4,973,377 | 11/1990 | Katsuoka et al. | 117/35 |
| 5,004,519 | 4/1991 | Hariri | 117/35 |
| 5,367,979 | 11/1994 | Watanabe et al. | 117/14 |

FOREIGN PATENT DOCUMENTS

| | | |
|---|---|---|
| 0504837A2 | 9/1992 | European Pat. Off. . |
| 0538048A1 | 4/1993 | European Pat. Off. . |
| 2133875 | 1/1973 | Germany ........................... 117/35 |

OTHER PUBLICATIONS

European Search Report.
Chemical Abstracts; Jan. 25, 1993, vol. 118, No. 4; "35 —Chemistry of Synthetic High Polymers"; pp. 591–592.

*Primary Examiner*—Robert Kunemund
*Attorney, Agent, or Firm*—Whitham, Curtis, Whitham & McGinn

[57] ABSTRACT

The present invention provides a method of growing silicon single crystals by the Czochralski method, wherein the strength of a neck may be increased so as to delete the risk of severance thereof in a simple and easy way without the use of mechanically complex devices and thereby growing of a single crystal of a larger diameter and heavy weight is made practically possible.

The method comprises the steps of: a single crystal being so grown from a seed crystal that the diameter of said single crystal gets gradually narrower until the length of a seed taper reaches 2.5 to 15 times the sectional size of the seed crystal; the diameter of a long near-cylindrical neck following the seed taper being so regulated that said diameter may be 0.09 to 0.9 times the sectional size of the seed crystal and 2.5 mm as the smallest in diameter; the spread of the diameter fluctuation of the neck being so restricted as to be less than 1 mm; and the length of the neck being so controlled as to be kept within the range of 200 mm to 600 mm.

7 Claims, 2 Drawing Sheets

METHOD OF GROWING SILICON SINGLE CRYSTALS

BACKGROUND OF THE INVENTION

1. Field of the Invention

The present invention relates to a method of growing silicon single crystals by the Czochralski method and more particularly, to the method of growing single silicon crystals, where the shape of a portion from a seed crystal to the lower end of a neck is specialized so as to increase the mechanical strength of the neck and thereby to make it possible to grow single silicon crystals of a larger diameter and heavier weight.

2. Description of the Prior Art

There is well known a method of growing a dislocation-free silicon single crystal by the Czochralski method, where single crystal silicon is used as a seed crystal and the seed crystal is contacted to a silicon melt, pulled up to grow a silicon single crystal at the lower end, the single crystal is squeezed in diameter to form a neck and thus to eliminate dislocations therein generated when the seed crystal contacts the melt, and thereafter the dislocation-free single crystal is continuously grown to get larger in diameter.

In this method, a near-cylindrical portion called a neck is preferably so formed as to have the smallest diameter practically possible in order to achieve the condition of being dislocation-free therein by necking or squeezing the diameter of the silicon single crystal following the seed crystal. For example, growing of the neck is performed with the dimensions and shape of less than about 3 mm in diameter and of about 30 mm to 200 mm in length.

Recently, silicon single crystals of a larger diameter have become increasingly required as starting material for semiconductor devices in order to realize high throughput and yield together with ever complicating designs in the device chips, which trend automatically entails requirements for a heavier weight of a silicon single crystal.

In this environment, the mechanical strength of a neck is more demanding, since all the weight of a growing crystal have to be supported during growth by the neck, which means a portion from the lower portion of a seed crystal to the lower end of the neck.

A simple solution to have a higher mechanical strength of the neck is to make the diameter of the neck larger throughout all the length thereof. Simply making the diameter larger has, however, inevitably a resulting difficulty in growing a larger diameter single crystal free of dislocations since the neck could not be grown free of dislocations and thereby the mechanical strength thereof is lowered, even though the mechanical strength of a squeezing portion itself may be increased, which is a tapered portion in transition from starting of a squeeze of the seed diameter to the upper end of the near-cylindrical neck, (hereafter referred to as a seed taper).

In the above-mentioned traditional way, the diameter of a neck is controlled to be less than about 3 mm so as to meet the condition for being free of dislocations and consequently the neck does not provide a strength enough to raise a heavy growing single crystal. With this size of the neck diameter, there is a limit of the diameter of a grown single crystal, say, at most of about 150 mm or 6 inches for usual lengths of grown single crystals and growing a single crystal of more than about 200 mm or 8 inches in diameter automatically forces to shorten the length available thereof due to indispensable total-weight limitation thereof, which results in poorer throughput and yield. Growing a single crystal of a larger diameter in excess of the limit causes a stress within the bulk of the neck beyond endurance, which naturally means a strong possibility of being severed in the neck in the course of growth and as a result leads to a terrible accident of free falling of a single crystal.

In addition to the above problem, the inventors have discovered in the course of the investigation, which finally brought them to make the present invention, another technical problem that a neck free of dislocations is week to plastic deformation and slippage both due to a tensile stress caused by a heavy weight of a single crystal, and due to higher temperatures of the surrounding working environment. The neck affected by slippages is deteriorated in mechanical strength and thus the probability to run a risk of free falling of a grown crystal due to severance in the neck is adversely increased.

What's more, in conventional methods of this kind, a variety of choices are adopted in regard to the shapes of seed taper, the length and diameter of a neck and there is, as a result, an inability in exactly locating where the condition of being dislocation-free starts in necking during growth. This additional week point of the conventional methods makes themselves unable to find out a way to delete the mechanically week portion from a necking process.

Specially designed supporting devices of a silicon single crystal might have a chance for the use in solving the disadvantages above-mentioned. The devices of these kinds are, however, not available with practicality in terms of cost and efficiency and have a plurality of technical problems, for example, of excessive cost, complexity of operation, impurities' contamination or the like in use.

SUMMARY OF THE INVENTION

The present invention was made in view of the problems included in the prior art technology above-mentioned and has an object to provide a method of growing silicon single crystal, which makes it possible; for a growing single crystal to be surely dislocation free in a comparatively simple and easy way without the use of mechanically complex devices even when the diameter of a neck is increased to a considerable extent; to clearly detect the position of becoming dislocation free; to eliminate a risk for the neck to be severed therein due to an improvement of non-occurrence of plastic deformation even after growth of a heavy single crystal portion; to increase the strength of the neck; and as a whole for a single crystal of a larger diameter and heavier weight to be practically grown even together with a higher throughput and yield.

The inventors have completed the present invention, whereby a very desirable method of growing a single crystal is provided, in which method a special shape is formed in a single crystal portion following a seed crystal portion ended at the lower end of a neck so as to prevent plastic deformation within the bulk of the neck and thereby to grow a cylindrical single crystal body of a larger diameter and heavier weight.

The present invention has been achieved with the help of the following discoveries resulted from a variety of tests or experiments in the course of investigation to solve the above-mentioned problems. The new discoveries by the inventors are: (1) that the plastic deformation as one of the main causes to severance of the neck is easier to occur, the heavier a single crystal is or the higher the temperature of the neck is, even though the strength of the neck is generally reinforced by increase in diameter; (2) that the plastic deformation is easier to occur the rougher the outside surface of the neck is in topography; (3) that the plastic deformation is triggered at the position of becoming dislocation-free when roughness of outside surface is small enough.

More particularly, the method of growing a single single crystal according to the present invention uses a specialized shape of the combination of a seed crystal, seed taper and neck selected from the following respective dimensional ranges, where the length of the seed taper is 2.5 to 15 times the diameter of the seed, the length of the long and near cylindrical neck portion or simply the neck, which follows the seed taper, is 0.09 to 0.9 times the diameter of the seed (provided that the neck is not allowed to be less than 2.5 mm in diameter), any single spread of the diameter fluctuation along the neck is less that 1 mm, and the length of the neck is 200 mm to 600 mm.

BRIEF DESCRIPTION OF THE DRAWINGS

Other features and objects of the present invention will become apparent from a study of the following description of a method of growing silicon single crystals and more particularly, the method of growing single silicon crystals, where the shape of a portion from a seed crystal to the lower end of a neck is specialized so as to increase the mechanical strength of the neck and thereby to make it possible to grow single silicon crystals of a larger diameter and heavier weight, together with the accompanying drawings, of which.

DETAILED DESCRIPTION OF THE PREFERRED EMBODIMENTS

Figure 1:
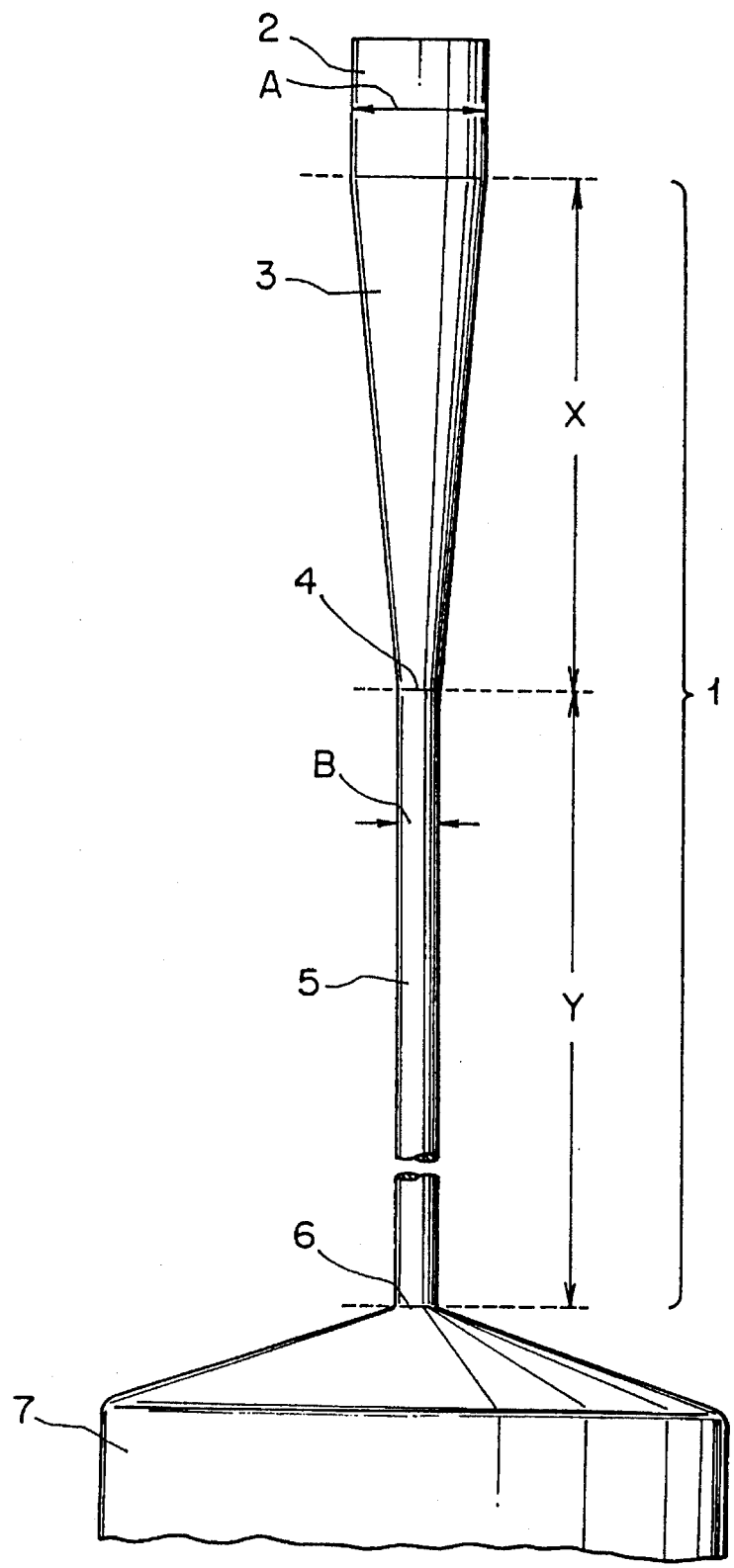
FIG. 1 is a schematic longitudinally sectional view illustrating an embodiment of the combination of a seed crystal, seed taper and neck according to the present invention.

An embodiment of the present invention will be described below in reference to the drawings.

The present invention provides a method of growing a dislocation-free silicon single crystal by the Czochralski method, where single crystal silicon is used as a seed crystal, the seed crystal is contacted to a silicon melt, a single crystal is grown at the lower end tip of the seed crystal, the single crystal is squeezed in diameter in the course of growth so as to form a specialized shape thereof having a circular section and thus the dislocation-free condition is realized therein, thereafter the single crystal is kept on growing at a constant diameter for a time, then gets increased in diameter up to a diameter, at which the single crystal is again kept on growing for a time to finally obtain a dislocation-free silicon single crystal body of a larger diameter and heavier weight.

According to the present invention, it is an important step to determine respective shapes of the seed taper and neck before starting so-called necking from a seed crystal. First of all, seed crystals used in the present invention are of single crystal and usually of shapes of a prism or cylinder, for example, a quadrangle or circle in section. The sectional sizes thereof are respectively expressed in the length of a side for a quadrangle in section or the diameter for a circle in section. The length or the diameter is mainly selected in the range of 10 mm to 30 mm and in case of a heavy single crystal to be grown preferably in the range of 15 mm to 30 mm. A seed crystal is too week at less than 10 mm of the sectional size to grow a single crystal of 8 inches in diameter, the growth operation being dangerous with the seed crystal of this size. On the other hand, a seed crystal more than 30 mm in the sectional size is not recommendable for use because of the the problem of higher cost of the seed crystal.

A seed crystal is dipped in a silicon melt contained in a quartz crucible and kept as dipped until a thermal equilibrium is reached between the seed crystal and the melt. The seed crystal is then pulled up and at the same time makes a single crystal being grown at the lower end tip. The single crystal forms a seed taper and then a neck in the course of continued growth. During the growth the single crystal is squeezed to form the seed taper and that is performed by gradually so narrowing the diameter of single crystal to form a predetermined shape. The narrowing is continued up to such narrowest diameter or diameter of the lower end of the seed taper that is smaller than the diameter of the seed crystal and the following growing part of the single crystal or the neck may become dislocation free. The neck is kept on growing at the narrowest diameter for a length thereof. The diameter of the neck is adjusted in the range of 0.09 to 0.9 times the sectional size of the seed crystal, preferably 0.14 to 0.6 of the same and concretely, for 10 mm to 30 mm of the size of the seed crystal: 2.5 mm to 10 mm, preferably 4 mm to 6 mm, of the diameter of the neck. With less than 2.5 mm of the diameter of the neck, the mechanical strength of the neck is not strong enough to pull up a single crystal of a larger diameter more than 8 inches, but on the other hand, more than 10 mm is not preferred in use, since a dislocation free single crystal is hard to be grown with the diameters.

In the method according to the present invention, a seed crystal is diametrally squeezed in the sectional shape of a circle in the course of single crystal growth and a neck is formed after the squeezing portion of the seed taper. The seed taper is specialized in shape by the squeezing from the lower end of the seed crystal to the upper end of the neck. In other words, the seed taper corresponds to a tapered portion, the diameter of which gradually decreases away from the seed crystal starting at the diameter of the seed crystal until it reaches that of the upper end of the neck, which is constant.

The length of the seed taper is selected in the range of 2.5 to 15 times, preferably 5 to 12 times, the sectional size of the seed crystal, in concrete terms, in the range of 50 mm to 150 mm, preferably 80 mm to 120 mm, of the length of the neck for the range of 10 mm to 30 mm of the sectional size of the seed. Within the above mentioned ranges, the dislocation free condition does not to fail to be achieved at the finishing end of squeezing crystal growth following the seed, said finishing end being a boundary of the seed taper and neck.

The neck formed according to the method of the present invention is integrally connected at the lower end of the seed taper and has the shape of a long near-cylinder having a circular section. Spreads of the fluctuation of the diameters or peak to valley heights of the irregularity of the outside surface along the neck have to be minimized and the allowable range is less than 1 mm, preferably less than 0.5 mm. When the spreads or peak to valley heights falls in the range more than 1 mm in value, the stress in the bulk of the neck is concentrated to the portion of a spread in excess of 1 mm and the concentration of stress is easy to cause plastic deformation in the neck, which automatically means inability of growing a single crystal having a heavier weight.

To the contrary, no concentration of stress is found in any portion of a neck with the speeds less than 1 mm as mentioned above. The problematic portion with respect to plastic deformation is only limited to the boundary portion because of less controllability of the diameters of the transitional region.

According to the present invention, the position of becoming dislocation free in a necking process or, in other words, the boundary of a seed taper and neck, is able to be identified by forming a seed taper of a specialized shape in the interim portion between the lower end to the upper end of the neck as explained before.

The neck is apt to be affected by plastic deformation at the position of becoming dislocation free or the boundary and what's more, the plastic deformation is easy to be adversely affected by higher temperatures of the neck or heavier weight of a growing crystal. Therefore, the boundary portion should be better positioned as distant as possible from the neighborhood of the surface of a silicon melt so as to keep the neck in a comparatively cooler condition before the weight of the growing single crystal is increased beyond a predetermined value. In concrete terms, it is desirable from a view point of preventing breakage of the neck due to plastic deformation that the temperatures of the boundary portion are controlled less than 800 degrees Celsius, while the environmental temperatures near the melt surface are in the neighborhood of the melting point of silicon, that is, about 1400 degrees Celsius.

The length of the neck has to be long enough in order to set the temperatures of the boundary portion in the range less than 800 degrees Celsius. That is, it is preferable to select the length of the neck in the range from 200 mm to 600 mm, preferably, from 300 mm to 500 mm. The plastic deformation is easy to occur when the length is less than 200 mm since the temperatures of the boundary could not be lowered under 800 degrees Celsius, but on the other hand the choice of the length more than 600 mm is not preferred on account of the poor throughput due to the excessiveness of the total length of a grown single crystal.

In the method according to the present invention, the growth speeds or pull-up speeds in the respective steps of seeding, necking and single crystal growth are not specially restricted as far as they are so controlled that the above-mentioned specialized shape from the lower end of the seed to the upper end of the neck may be achieved. For example, the speeds in the step of necking may be selected in the range from 2 mm/min to 6 mm/min and those in the step of growing the body portion of a single crystal may be selected in the range from 0.2 mm/min to 2 mm/min.

The shapes or dimensions of the above-mentioned seed crystal, seed taper, and neck may be measured and controlled automatically or manually with the help of naked eyes assisted by a scale, a CCD camera, a laser or pyrometer assisted measuring instruments and the like.

The method will now be described in depth in reference to the drawings. FIG. 1 is a schematic longitudinally sectional view illustrating an embodiment of the combination of a seed crystal, seed taper and neck according to the present invention; and FIG. 2 is an enlarged partial schematic view of FIG. 1.

The whole shape of the combination 1 of a seed crystal, seed taper and neck is so formed as to be shown in FIG. 1 and the growing process thereof will be described below: the single crystal grown from the seed 2 having the shape of a prism or cylinder, gets narrower downwardly starting at the lower end of the seed crystal to form the seed taper 3, which ends at the position where the dislocation-free condition shows up for the first time or at the boundary 4, said single crystal is further continued to grow at a constant diameter from said position 4 to form a long near-cylindrical neck 5, and still further continued to grow larger in diameter from the lower end 6 of said neck 5 to form finally a single crystal body 7 of a constant larger diameter.

For a later reference, several alphabetical letters are respectively given as symbols to the dimensions of parts of the combination 1 of the seed crystal, seed taper and neck, that is, A to the sectional size of the seed, B to the diameter of the neck, X to the length of the seed taper 3 and Y to the length of the neck.

Figure 2:
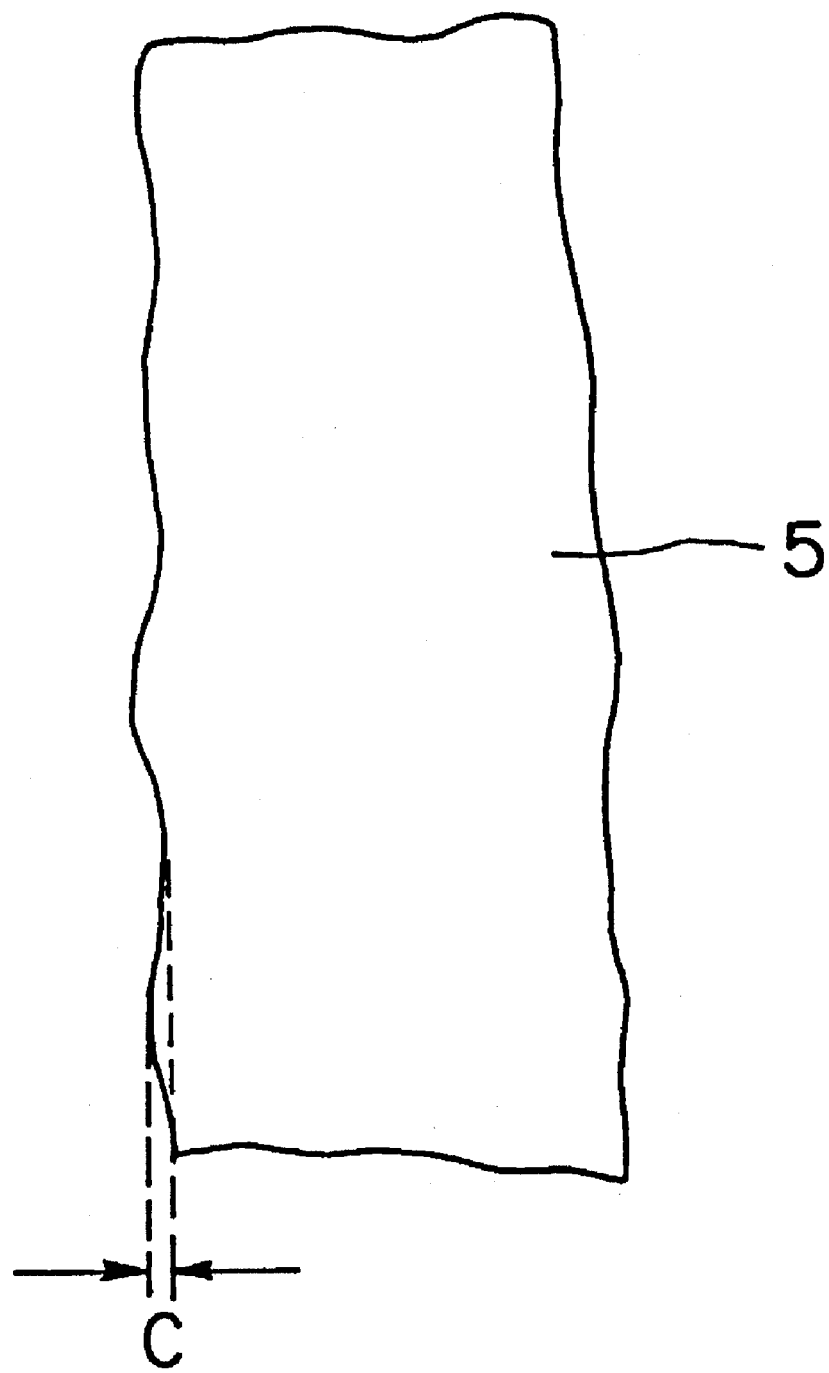
FIG. 2 is an enlarged partial schematic view of FIG. 1.

Further, as shown in FIG. 2, minute surface irregularities are inevitably formed on the outside surface of the neck 5 as the result of diameter control, the peak-to-valley height C of which have to be regulated less than a give value so as to diminish chances to have plastic deformation in the neck 5 and thus to increase the mechanical strength thereof, for a peak-to-valley height is one of the causes of plastic deformation when the same height is in excess.

Experiments have been carried out in the following way. A plurality of batches of growing silicon single crystals were operated by the Czochralski method, The atmosphere within the pull chamber of a silicon single crystal grower was under reduced pressure and the size of a quartz crucible was 20 inches in diameter and the hot zone assembly was so designed and installed that said crucible might be properly accommodated. As to the outline of the operation, a prismatic seed crystal was dipped into a silicon melt, then said seed crystal was raised to grow a single crystal therefrom, the growing single crystal was narrowed to form successively a seed taper and neck, and thereafter to the contrary was thickened or diametrally increased to grow single crystals of 8 inches in diameter, which were each 80 kgs. in weight and final products of the experiments.

These experiments adopted various combinations of the sectional sizes of prismatic seed crystals A, the diameters of necks B, peak-to-valley heights C, the lengths of seed tapers X and the lengths of necks Y. Plastic deformation or slippages were inspected on the samples, which results are shown in Table 1.

The measurement of the above-mentioned size or dimensions was conducted with a diametral measuring instrument assisted by laser. The observation of occurrence of plastic deformation was made in a series of the steps of: combined part of the seed, seed taper and neck were sampled from each batch of the growths; the samples were sirtl-etched; and finally the partly etched surfaces of the necks were observed with regard to yes or no of the occurrence.

TABLE 1

|  | A (mm) | B (mm) | C (mm) | X(mm) | Y(mm) | Slippage |
| --- | --- | --- | --- | --- | --- | --- |
| Example 1 | 10 | 3.5 | 0.5 | 100 | 300 | no |
| Example 2 | 15 | 3.5 | 1.0 | 150 | 300 | no |
| Example 3 | 15 | 4.5 | 0.8 | 100 | 400 | no |
| Example 4 | 20 | 5.0 | 1.0 | 150 | 400 | no |
| Comparison 1 | 12 | 11.0 | 1.0 | 100 | 300 | with dislocations |
| Comparison 2 | 10 | 2.0 | 0.5 | 150 | 400 | yes |
| Comparison 3 | 15 | 4.5 | 2.0 | 50 | 400 | yes |
| Comparison 4 | 20 | 5.0 | 0.8 | 100 | 100 | yes at the boundary |

TABLE 1-continued

|  | A (mm) | B (mm) | C (mm) | X(mm) | Y(mm) | Slippage |
|---|---|---|---|---|---|---|
| Comparison 5 | 15 | 4.0 | 0.8 | 200 | 50 | yes at the boundary |

The examples in the Table 1 are all of the method according to the present invention and they disclose that the method of the present invention is capable of preventing occurrence of slippage, but the comparisons conducted outside the scope of the present invention as hereinafter claimed show only adverse effects as disclosed in the same Table, where the condition of being dislocation-free was not observed in comparison 1, slippage occurred in the necks of comparisons 2 and 3, and slippage were observed at the boundaries of comparisons 4 and 5.

Next another group of experiments were conducted under the same conditions only except the size of the quartz crucible used, which was a diameter of 24 inches or about 300 mm, and the weight of grown single crystals, which was each 150 kegs in weight. In these experiments, various sizes and dimensions were also selected as the conditions for the experiments and plastic deformation or slippage was inspected on the samples from each of the experiments, which results were tabulated in Table 2.

TABLE 2

|  | A (mm) | B (mm) | C (mm) | X(mm) | Y(mm) | Slippage |
|---|---|---|---|---|---|---|
| Example 5 | 15 | 4.5 | 0.5 | 100 | 300 | no |
| Example 6 | 20 | 6.0 | 0.7 | 150 | 300 | no |
| Comparison 6 | 20 | 10.0 | 0.8 | 150 | 100 | yes at the boundary |

The examples 5 to 6 are of the method according to the present invention, which shows no slippage, but the comparison 6 shows slippage at the boundary, where the experimental conditions were selected outside the scope of the present invention as hereinafter claimed.

According to the method of growing silicon single crystals of the present invention, the condition of being dislocation-free is sure to be realized in a neck even though the neck is considerably large in diameter since the specialized shape of the combination of a seed crystal, seed taper and neck is adopted. In addition, the position of becoming dislocation-free is exactly determined in the neck and thus the probability to run the risk of free-falling of growing crystals during or after growth due to severance of the neck is minimized through preventing plastic deformation. With the method according to the present invention, the strength of a neck may be increased in a comparatively simple and easy way as mentioned above, thereby single crystals having a larger diameter, which means crystals of more than 8 inches in diameter, and a heavier weight may be grown together with the result of an outstandingly increase in throughput or yield.

It is concluded that the present invention makes it possible to practically grow single crystals of more than 12 inches in diameter and thus should be highly evaluated from the view point of the industrial utilization thereof in the near future.

What is claimed is:

1. A method of growing silicon single crystals, comprising the steps of:

a single crystal being so grown from a seed crystal that the diameter of said single crystal gets gradually narrower until the length of a seed taper reaches 2.5 to 15 times the sectional size of the seed crystal;

the diameter of a long near-cylindrical neck following the seed taper being so regulated that said diameter may be 0.09 to 0.9 times the sectional size of the seed crystal 2 and 2.5 mm as the smallest in diameter;

the spread of the diameter fluctuation of the neck being so restricted as to be less than 1 mm; and the length of the neck being so controlled as to be kept within the range of 200 mm to 600 mm.

2. The method according to claim 1, wherein the length of the seed taper is regulated to be 5 to 15 times the sectional size of the seed crystal.

3. The method according to claim 1, wherein the length of the seed taper is regulated to be 5 to 12 times the sectional size of the seed crystal.

4. The method according to claim 1, wherein the diameter of the neck is regulated to be 0.14 to 0.6 times the sectional size of the seed crystal and 2.5 mm as the smallest in diameter.

5. The method according to claim 1, wherein the spread of the diameter fluctuation of the neck is restricted to be less than 0.5 mm.

6. The method according to claim 1, wherein the length of the neck is controlled to be 300 mm to 500 mm.

7. A method of growing silicon single crystals comprising the steps of:

a single crystal being so grown from a seed crystal that the diameter of said single crystal gets gradually narrower until the length of a seed taper reaches 2.5 to 15 times the sectional size of the seed crystal;

the diameter of a long near-cylindrical neck following the seed taper being so regulated that said diameter may be 0.09 to 0.9 times the sectional size of the seed crystal and 2.5 mm as the smallest in diameter;

the spread of the diameter fluctuation of the neck being so restricted as to be less than 1 mm; and the temperatures of the neck is so controlled as to be less than about 800 degrees Celsius by positioning the neck distant enough away from the surface of a silicon melt before the weight of the growing crystal gets too heavy.

* * * * *